(12) United States Patent
Shaviv et al.

(10) Patent No.: US 9,758,896 B2
(45) Date of Patent: Sep. 12, 2017

(54) FORMING COBALT INTERCONNECTIONS ON A SUBSTRATE

(71) Applicant: APPLIED Materials, Inc., Santa Clara, CA (US)

(72) Inventors: Roey Shaviv, Palo Alto, CA (US); John Lam, San Jose, CA (US); Timothy Bochman, Kalispell, MT (US)

(73) Assignee: APPLIED Materials, Inc., Santa Clara, CA (US)

( * ) Notice: Subject to any disclaimer, the term of this patent is extended or adjusted under 35 U.S.C. 154(b) by 301 days.

(21) Appl. No.: 14/621,155

(22) Filed: Feb. 12, 2015

(65) Prior Publication Data
US 2016/0237587 A1    Aug. 18, 2016

(51) Int. Cl.
| | |
|---|---|
| *C25D 3/12* | (2006.01) |
| *C25D 3/56* | (2006.01) |
| *C25D 5/10* | (2006.01) |
| *C25D 5/18* | (2006.01) |
| *C25D 5/50* | (2006.01) |
| *C25D 5/48* | (2006.01) |
| *C25D 7/12* | (2006.01) |
| *C25D 17/00* | (2006.01) |

(Continued)

(52) U.S. Cl.
CPC ............ *C25D 17/001* (2013.01); *C25D 3/12* (2013.01); *C25D 5/10* (2013.01); *C25D 5/18* (2013.01); *C25D 5/50* (2013.01); *C25D 7/123* (2013.01); *H01L 21/6723* (2013.01); *H01L 21/67276* (2013.01); *H01L 21/67769* (2013.01)

(58) Field of Classification Search
CPC . C25D 7/12; C25D 7/123; C25D 5/10; C25D 5/16; C25D 5/18; C25D 3/12
See application file for complete search history.

(56) References Cited

U.S. PATENT DOCUMENTS

| | | | |
|---|---|---|---|
| 6,720,263 B2 | 4/2004 | Olgado et al. | |
| 6,808,612 B2 | 10/2004 | Hey et al. | |
| 6,913,680 B1 | 7/2005 | Zheng et al. | |

(Continued)

FOREIGN PATENT DOCUMENTS

| | | |
|---|---|---|
| JP | 2003328184 A | 11/2003 |
| JP | 2004-346399 A | 12/2004 |

(Continued)

OTHER PUBLICATIONS

Korean Intellectual Property Office, The International Search Report and the Written Opinion of the International Searching Authority issued in International Application No. PCT/US2015/067903 (Apr. 28, 2016).

*Primary Examiner* — Brian W Cohen
(74) *Attorney, Agent, or Firm* — Kenneth H. Ohriner; Perkins Coie LLP

(57) ABSTRACT

A wafer electroplating system has at least one first electroplating chamber having a first electrolyte containing cobalt ions, and is adapted to electroplate a cobalt film onto a wafer at a first deposition rate. A second electroplating chamber has a second electrolyte containing cobalt ions, and is adapted to electroplate a cobalt film onto the wafer at a second deposition rate faster than the first deposition rate. The first and second electroplating chambers are within an enclosure of a processing system. A robot moves a wafer among the first and second electroplating chambers.

8 Claims, 4 Drawing Sheets

(51) Int. Cl.
*H01L 21/67* (2006.01)
*H01L 21/677* (2006.01)

(56) References Cited

U.S. PATENT DOCUMENTS

| | | |
|---|---|---|
| 7,192,495 B1 | 3/2007 | Collins |
| 7,279,408 B2 | 10/2007 | Inoue et al. |
| 7,794,530 B2 | 9/2010 | Vaskelis et al. |
| 7,846,306 B2 | 12/2010 | Hafezi et al. |
| 8,187,970 B2 | 5/2012 | Ganguli et al. |
| 8,563,424 B2 | 10/2013 | Ganguli et al. |
| 8,815,724 B2 | 8/2014 | Ganguli et al. |
| 9,359,683 B2 * | 6/2016 | Kim ................... C25D 3/56 |
| 2002/0084529 A1 | 7/2002 | Dubin et al. |
| 2002/0127847 A1 | 9/2002 | Alling et al. |
| 2004/0198055 A1 | 10/2004 | Wang |
| 2005/0081744 A1 | 4/2005 | Klocke |
| 2005/0266265 A1 | 12/2005 | Cheng et al. |
| 2006/0035016 A1 | 2/2006 | Tiwari |
| 2007/0105377 A1 | 5/2007 | Koos |
| 2007/0108063 A1 | 5/2007 | Nakada et al. |
| 2009/0053426 A1 | 2/2009 | Lu et al. |
| 2010/0013107 A1 | 1/2010 | Sandhu |
| 2011/0163449 A1 | 7/2011 | Kelly |
| 2012/0153483 A1 | 6/2012 | Akolkar |
| 2014/0008812 A1 | 1/2014 | Emesh |
| 2015/0054174 A1* | 2/2015 | Lo .................... H01L 23/53214 257/774 |

FOREIGN PATENT DOCUMENTS

| | | |
|---|---|---|
| KR | 10-2008-0010801 A | 1/2008 |
| KR | 10-1182155 B1 | 9/2012 |
| KR | 10-2014-0087252 A | 7/2014 |
| KR | 10-2014-0143148 A | 12/2014 |
| WO | 2006102318 A2 | 9/2006 |

* cited by examiner

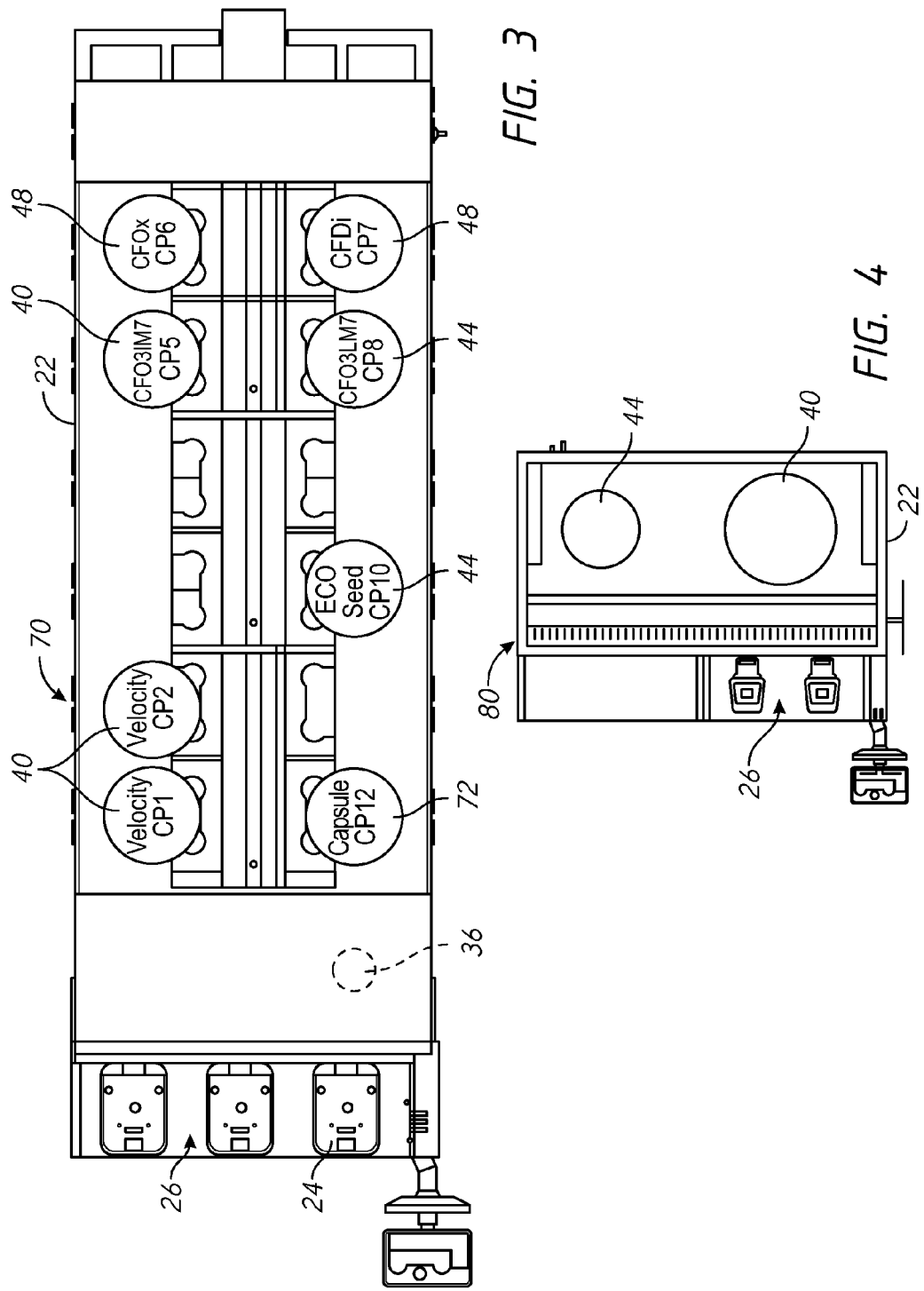

FORMING COBALT INTERCONNECTIONS ON A SUBSTRATE

FIELD OF THE INVENTION

The field of the invention is systems and methods for electrochemically processing micro-scale work pieces, wafers or substrates.

BACKGROUND OF THE INVENTION

Microelectronic devices, such as micro-scale electronic, electro-mechanical or optical devices are generally fabricated on and/or in work pieces or substrates, such as silicon wafers. In a typical fabrication process, a wafer is placed in an electrolyte containing metal ions. A blanket layer or patterned layer of metal is plated onto the substrate by conducting electric current through the electrolyte and through a seed layer on the substrate. The substrate is then cleaned, etched and/or annealed in subsequent procedures, to form devices, contacts or conductive lines.

Currently, most micro-electronic devices are made on substrates plated with copper. Although copper has high conductivity, it typically requires a barrier layer such as tantalum nitride (TaN) to prevent diffusion of copper into the substrate. As the features get smaller, the barrier layer required for copper occupies a relatively larger volume, because a minimum barrier layer thickness must be maintained to prevent copper diffusion, regardless of feature size. In addition, consistently obtaining void-free copper filling of ever smaller features is increasingly difficult.

One approach proposed for overcoming these technical challenges is to replace copper with a metal that does not require a barrier layer, such as cobalt. Although cobalt has a higher resistance than copper (6 uOhm-cm for cobalt versus 2 uOhm-cm for copper), cobalt may not require a barrier layer because it does not diffuse into the silicon or dielectric. Using cobalt instead of copper may also help to overcome the increased copper resistivity due to scattering of the charge carrying electrons and the decrease in the cross sections of the conductor lines. However, existing systems and methods for plating cobalt for this purpose are disadvantageous relative to currently available copper processes. Accordingly, improved systems and methods for creating microelectronic devices with cobalt are needed.

SUMMARY OF THE INVENTION

A wafer electroplating system has at least one first electroplating chamber having a first electrolyte containing cobalt ions, and is adapted to electroplate a cobalt film onto a wafer at a first deposition rate. A second electroplating chamber has a second electrolyte containing cobalt ions, and is adapted to electroplate a cobalt film onto the wafer at a second deposition rate faster than the first deposition rate. The first and second electroplating chambers are within an enclosure of a processing system. A robot moves a wafer among the first and second electroplating chambers. A system having a single plating chamber may also be used.

BRIEF DESCRIPTION OF THE DRAWINGS

FIG. 3 is a schematic plan view of an alternative processing apparatus.
FIG. 4 is a schematic plan view of another alternative processing apparatus.

DETAILED DESCRIPTION

Figure 1:
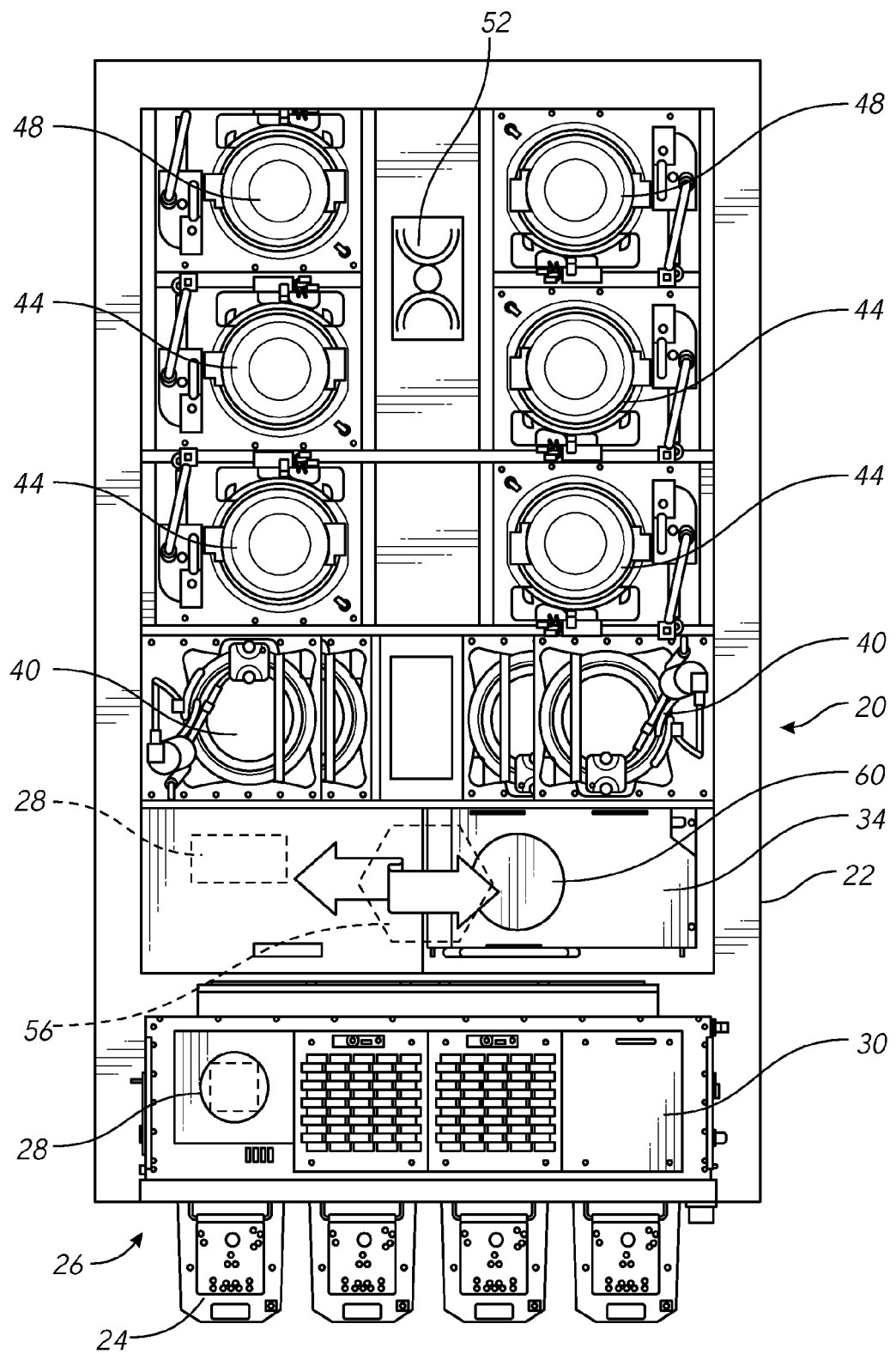
FIG. 1 is a schematic plan view of a processing apparatus.

As shown in FIG. 1 a processing system 20 has multiple processing apparatus, chambers or stations within an enclosure 22. In a typical configuration, a docking station 26 is provided at a front end of the enclosure. Containers 24 holding wafers 60 are docked and unsealed at the docking station. A load robot 36 moves wafers 60 from docked containers 24 into one or more stations in the enclosure 22. One or more plasma or thermal treatment chambers 30, anneal chambers 34, wafer clean chambers 40, slow cobalt plating chambers 44 and fast cobalt plating chambers may be used. In the example shown, two wafer clean chambers 40, four slow cobalt plating chambers 44 and two fast cobalt plating chambers 48 are shown. The chambers may be modular units that can be individually swapped out of the system 20 for maintenance or repair. A process robot 52 moves wafers 60 among the chambers. A buffer 56 in the form of stacked shelves may be provided to facilitate handoff of wafers from the load robot 36 to the process robot 52, and vice versa.

Figure 2:
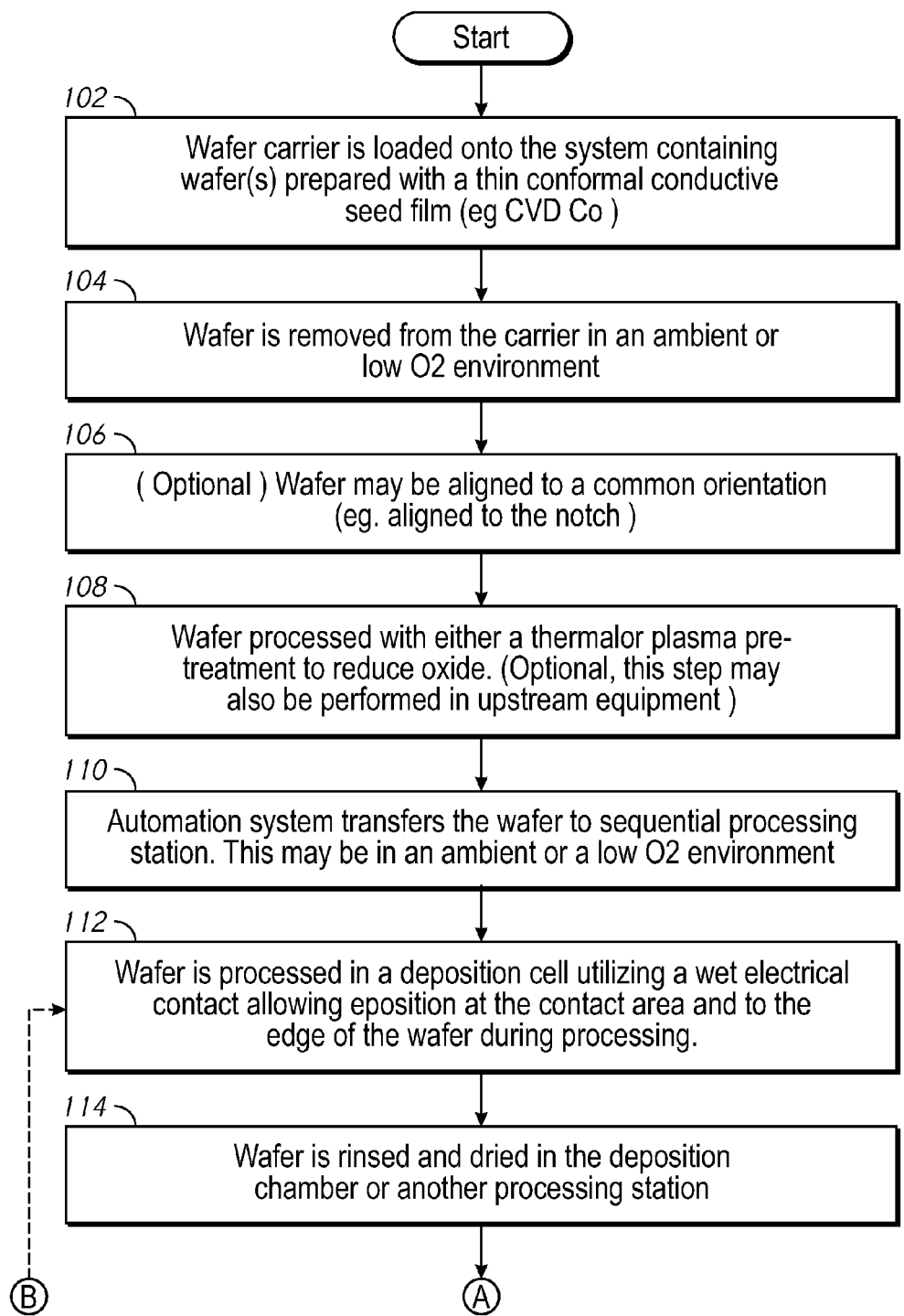
FIG. 2 is a flow chart, split over two drawing sheets, showing a process which may be performed using the apparatus of FIG. 1.
Figure 2:
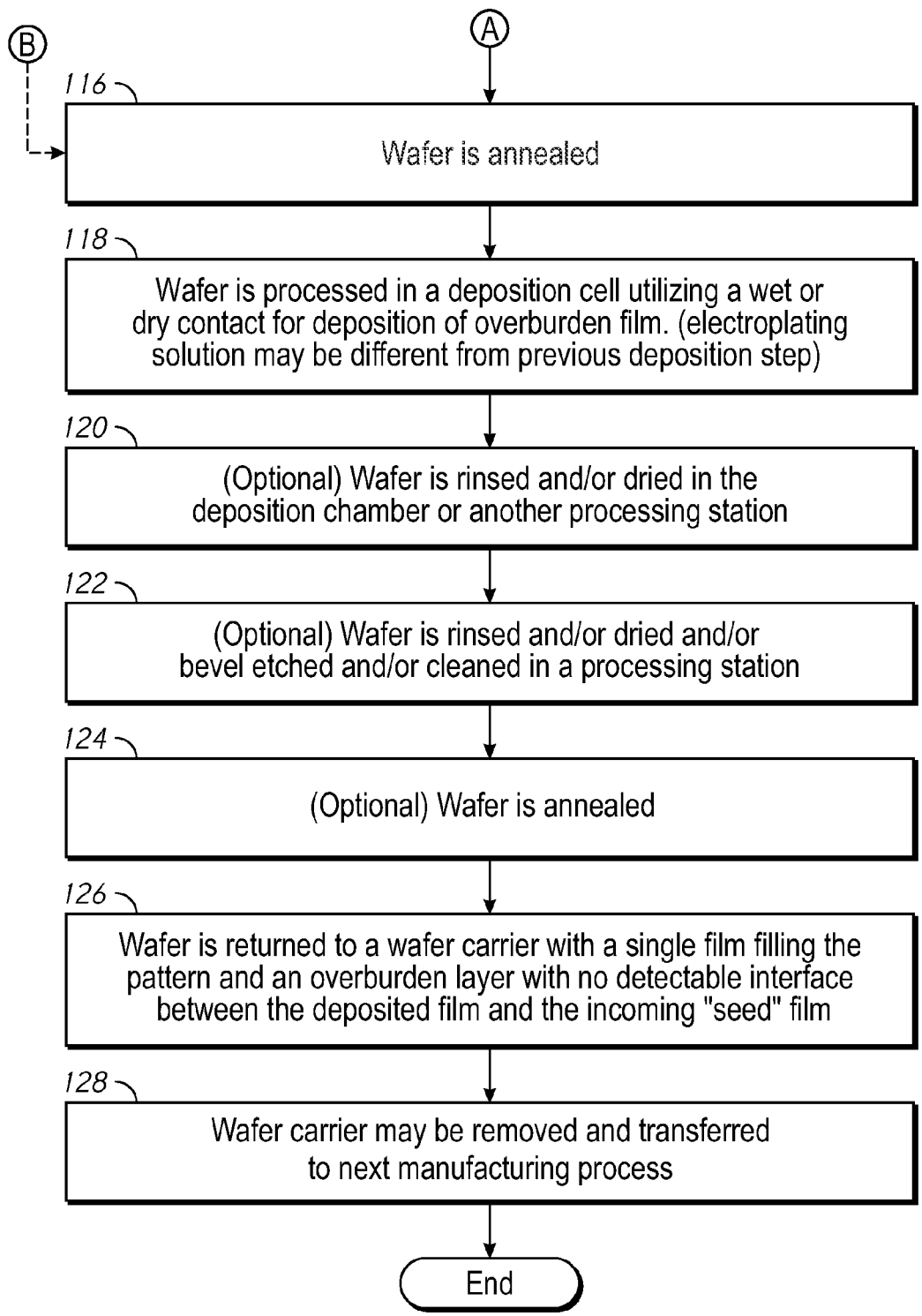

In the example of FIG. 1, the four slow cobalt plating chambers 44 and the two fast cobalt plating chambers 48 enable high volume manufacture of cobalt interconnects. As shown in FIG. 2, the system 20 of FIG. 1 may perform processing of wafers beginning at step 102 where a wafer container 24 is loaded or docked on or at the system 20. Wafers 60 in the container 24 have a conductive seed layer. At step 104 the load robot 36 removes a wafer 60 from the wafer container 24. If the wafer container 24 is sealed with the enclosure 22 of the system 20, the wafer 60 may be maintained in a controlled environment at all times. The controlled environment may be a low oxygen environment to prevent oxidation of the seed layer, or other surfaces of the wafer 60.

If the wafer 60 has a notch, typically used to indicate a crystal orientation, at step 106 the wafer may be rotated slightly to align the notch, at an alignment station 28. The load robot 36 optionally then moves the wafer 60 from the alignment station 28 (if used) to the plasma chamber 30 to provide a thermal or plasma pretreatment step to reduce or remove oxidation from the seed layer. This step may optionally be performed in upstream equipment before the wafer 60 is delivered to the system 20. This step and the notch alignment steps may be omitted.

The load robot 36 then hands off the wafer to the process robot 52, typically with the wafer temporarily placed on a shelf or buffer 56. At step 110 the process robot 52 moves the wafer 60 into one of the slow cobalt plating chambers 44. These chambers 44 may have a wet contact ring, i.e., a contact ring that does not make a liquid-tight seal against the wafer surface. The wet contact ring allows deposition of cobalt onto the seed layer, out to the edge of the wafer 60. At step 112 cobalt is electroplated onto the seed layer of the wafer 60 within a slow cobalt plating chamber 44. This plating step 112 is intentionally designed as a slow process that may be optimized for filling extremely small features in a wafer having a high resistance seed layer. Step 112 continues until the features are filled with plated cobalt.

After the features are filled, the wafer is then moved at step 114 to a cleaning chamber 40 to remove any electrolyte left on the wafer from the slow cobalt plating process at step 112. At step 116 the wafer 60 may be moved to the anneal chamber 34 for annealing to improve the plated cobalt film properties and gap fill performance of the plated cobalt in the filled features.

As shown by the dotted line in FIG. 2 running from step 116 back up to step 112, multiple cycles of slow cobalt plating may be used, with each cycle partially filling the features of the wafer, and with each slow cobalt plating step 112 followed by an annealing step 116. After the features are filled using step 112 one or more times, the wafer 60 may be optionally cleaned again at step 114 and then moved by the process robot 52 to one of the fast cobalt plating chambers 48, where at step 118 an overburden layer of cobalt is applied onto the wafer 60. The overburden layer acts as a sacrificial layer for a subsequent Chemical Mechanical Planarization or CMP step.

The fast cobalt plating chambers 48 may use a wet contact ring or a dry contact ring. Typically the fast cobalt plating chambers 48 also use an electrolyte different from the electrolyte in the slow cobalt plating chambers 44. A dry contact ring refers to a contact ring having a seal which seals the electrolyte away from the electrical contacts or fingers of the contact ring. The fast cobalt plating chambers 48 may deposit a cobalt film at a rate 2 or 5- to 20 times faster than the slow cobalt plating chambers.

The wafer 60 is then optionally rinsed and dried at step 120, and/or bevel etched or backside cleaned at step 122, with or without a follow on anneal at step 124. At step 126 the wafer 60 is returned to a wafer container 24. The wafer container 24 is then moved via factory automation to a subsequent system for downstream processing.

The plating steps in the slow and fast cobalt plating chambers 44 and 48 may be controlled using an algorithm so that wafers can be run in parallel using multiple slow and fast chambers simultaneously, to enable wafer throughput to meet high volume manufacturing needs. The use of the slow and fast plating steps 112 and 118 produces wafers having essentially a single cobalt plated film filling the pattern on the wafer, and an overburden layer with no detectable interface between the plated film and the seed layer.

FIG. 3 shows an alternative system 70 including a rinse/dry and/or bevel etch chamber 72, two wafer cleaning chambers 40, and a total of five slow and fast cobalt plating chambers. Depending on the specific application, in this configuration, there may be four or three slow cobalt plating chambers and one or two fast cobalt plating chambers.

FIG. 4 shows an alternative compact system 80 having a single slow cobalt plating chamber 44 and a single additional chamber 40 for cleaning the wafer by spin rinsing and drying the wafer, and optionally also providing a bevel etch process. This compact system may be paired with another similar compact system having a single fast cobalt plating chamber 48, and a single additional chamber 40 for cleaning and/or bevel etching the wafer. After processing in the first system 80, the wafer is moved into the second system to complete the plating process. Several of the compact systems 80 having the slow cobalt plating chamber 44 may be matched up and operate with a single system 80 having a fast cobalt plating chamber.

Various known electro-chemical deposition or plating chambers may be used as the slow cobalt plating chambers 44 and as the fast cobalt plating chambers 48, such as the plating chambers described in U.S. Pat. No. 8,496,790. As used here, the term wafer includes any substrate on which microelectronic or other micro-scale devices are formed.

Cobalt is several times more resistive than copper. The resistance between a cobalt containing seed layer and the contact pins of the contact ring may therefore be much higher than with copper. If the contact pins are exposed to air, joule heating may burn the seed layer, resulting in defects. This effect may be avoided using a wet contact ring (having no seal) where the contact pins and the entire seed layer are immersed in the electrolyte, which largely negates joule heating. As a result, for plating a more highly resistive seed layer, such as a cobalt or nickel seed layer, having a resistance of e.g., greater than 50, 100 or 200 ohms/square (and up to e.g., 1000 or 5000 ohms/square), a wet contact ring may advantageously be used, for example in the slow plating chamber. After the initial plating, when the metal layer is much less resistive, as when plating in the fast plating chamber, a dry plating ring may be used.

Thus, novel systems and methods have been shown and described. Various changes and substitutions may of course be made without departing from the spirit and scope of the invention. The invention, therefore, should not be limited, except by the following claims and their equivalents.

The invention claimed is:

1. A processing method comprising:
   A] placing a wafer into a first electroplating chamber having a first electrolyte containing cobalt ions;
   B] electroplating a first cobalt film onto the wafer at a first deposition rate;
   C] rinsing and drying the wafer;
   after performing step C];
   D] placing the wafer into a second electroplating chamber having a second electrolyte containing cobalt ions; and
   E] electroplating a second cobalt film onto the wafer at a second deposition rate two to twenty times faster than the first deposition rate.

2. The method of claim 1 wherein the first and second electroplating chambers are within a single enclosure, and further including annealing the wafer within the enclosure after step B and before step C.

3. The method of claim 2 further including plasma or thermally pretreating the wafer within the enclosure.

4. The method of claim 1 further including annealing the wafer after step B and then repeating step B at least once.

5. The method of claim 1 wherein in step B the first electrolyte touches an entire down-facing surface of the wafer.

6. The method of claim 5 wherein in step D, the second electrolyte is sealed off from electrical contacts at a perimeter of the wafer.

7. The method of claim 1 further including annealing the wafer after step D.

8. The method of claim 1 wherein the first electrolyte is different from the second electrolyte.

* * * * *